(12) United States Patent
Park et al.

(10) Patent No.: US 10,658,413 B2
(45) Date of Patent: May 19, 2020

(54) SEMICONDUCTOR DEVICE INCLUDING VIA PLUG

(71) Applicant: SAMSUNG ELECTRONICS CO., LTD., Suwon-si, Gyeonggi-do (KR)

(72) Inventors: Sun Woo Park, Hwaseong-si (KR);
Sun Hyun Kim, Hwaseong-si (KR);
Ho Woo Park, Hwaseong-si (KR);
Eung Kyu Lee, Hwaseong-si (KR);
Chang Keun Lee, Hwaseong-si (KR);
Hisanori Ihara, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 16/029,260

(22) Filed: Jul. 6, 2018

(65) Prior Publication Data

US 2019/0198552 A1     Jun. 27, 2019

(30) Foreign Application Priority Data

Dec. 26, 2017  (KR) .......................... 10-2017-0179706

(51) Int. Cl.
*H01L 27/146*     (2006.01)
*H01L 23/00*      (2006.01)

(52) U.S. Cl.
CPC ........ *H01L 27/14636* (2013.01); *H01L 24/08* (2013.01); *H01L 24/80* (2013.01); *H01L 27/1469* (2013.01); *H01L 27/14634* (2013.01); *H01L 27/1463* (2013.01); *H01L 27/1464* (2013.01); *H01L 27/14645* (2013.01);
(Continued)

(58) Field of Classification Search
CPC ......... H01L 27/14636; H01L 27/14634; H01L 27/1469; H01L 27/1464; H01L 24/08; H01L 2224/08146; H01L 2224/80896; H01L 27/14645; H01L 24/80
USPC ........................................... 257/448
See application file for complete search history.

(56) References Cited

U.S. PATENT DOCUMENTS

| 8,313,977 B2 | 11/2012 | Kim |
| 8,853,852 B2 | 10/2014 | Hayashi |
| 2012/0238051 A1 | 9/2012 | Park |

(Continued)

FOREIGN PATENT DOCUMENTS

| JP | 2009-027132 A | 2/2009 |
| JP | 2013-115289 A | 6/2013 |

(Continued)

*Primary Examiner* — Tong-Ho Kim
(74) *Attorney, Agent, or Firm* — Lee IP Law, PC

(57) ABSTRACT

A semiconductor device includes a lower insulating layer on a lower substrate, a lower pad structure inside the lower insulating layer, an upper insulating layer on the lower insulating layer, an upper pad structure inside the upper insulating layer, and an upper substrate on the upper insulating layer. A via plug passes through at least a portion of each of the upper substrate, the upper insulating layer, and the lower insulating layer, and in contact with the upper pad structure and the lower pad structure. The upper pad structure includes upper pad conductive layers and an upper connection layer between the upper pad conductive layers. The upper connection layer includes a conductive pattern having a shape different from a shape of at least one of the upper pad conductive layers. The via plug is in direct contact with the upper pad conductive layers and the upper connection layer.

19 Claims, 17 Drawing Sheets

(52) U.S. Cl.
CPC ............... *H01L 2224/08146* (2013.01); *H01L 2224/80896* (2013.01)

(56) References Cited

U.S. PATENT DOCUMENTS

| | | | |
|---|---|---|---|
| 2013/0321680 A1* | 12/2013 | Kumano | H01L 27/14636 348/273 |
| 2013/0323875 A1 | 12/2013 | Park et al. | |
| 2015/0221695 A1 | 8/2015 | Park et al. | |
| 2016/0365374 A1 | 12/2016 | Park et al. | |
| 2017/0040373 A1 | 2/2017 | Kim et al. | |
| 2017/0154873 A1 | 6/2017 | Kim et al. | |

FOREIGN PATENT DOCUMENTS

| | | | |
|---|---|---|---|
| JP | 2013-251539 A | 12/2013 | |
| JP | 2016-219792 A | 12/2016 | |
| JP | 6185287 B2 | 8/2017 | |
| KR | 10-2007-0083348 A | 8/2007 | |
| KR | 10-2010-0063269 A | 6/2010 | |

* cited by examiner

SEMICONDUCTOR DEVICE INCLUDING VIA PLUG

CROSS-REFERENCE TO RELATED APPLICATION

Korean Patent Application No. 10-2017-0179706, filed on Dec. 26, 2017, and entitled: "Semiconductor Device Including Via Plug," is incorporated by reference herein in its entirety.

BACKGROUND

1. Field

One or more embodiments described herein relate to a semiconductor device including a via plug.

2. Description of the Related Art

Attempts are continually underway to reduce the size and weight of electronic devices. This has resulted in the development of various approaches to reduce the size of semiconductor devices. One approach involves bonding together and electrically connecting semiconductor chips having different unit elements.

SUMMARY

In accordance with one or more embodiments, a semiconductor device includes a lower insulating layer on a lower substrate; a lower pad structure inside the lower insulating layer; an upper insulating layer on the lower insulating layer; an upper pad structure inside the upper insulating layer; an upper substrate on the upper insulating layer; and a via plug passing through at least a portion of each of the upper substrate, the upper insulating layer, and the lower insulating layer, the via plug in contact with the upper pad structure and the lower pad structure. The upper pad structure includes a plurality of upper pad conductive layers and an upper connection layer between the plurality of upper pad conductive layers, the upper connection layer includes a conductive pattern having a shape different from a shape of at least one of the upper pad conductive layers, and the via plug is in direct contact with the upper pad conductive layers and the upper connection layer.

In accordance with one or more other embodiments, a semiconductor device includes a lower insulating layer on a lower substrate; a lower pad structure inside the lower insulating layer; an upper insulating layer on the lower insulating layer; an upper pad structure inside the upper insulating layer and adjacent to the lower pad structure; an upper substrate on the upper insulating layer; and a via plug overlapping the upper pad structure and the lower pad structure. The upper pad structure includes a plurality of upper pad conductive layers and an upper connection layer formed between the plurality of upper pad conductive layers, wherein the upper connection layer includes a conductive pattern having a shape different from that of at least one of the upper pad conductive layers, and wherein the via plug overlaps the upper connection layer.

In accordance with one or more other embodiments, a semiconductor device includes a lower insulating layer on a lower substrate; a lower pad structure inside the lower insulating layer; an upper insulating layer on the lower insulating layer; an upper pad structure inside the upper insulating layer; an upper substrate having a cell region and a via region on the upper insulating layer; a photodiode inside the upper substrate in the cell region; and a via plug passing through at least a portion of each of the upper substrate, the upper insulating layer, and the lower insulating layer in the via region, the via plug in contact with the upper pad structure and the lower pad structure. The upper pad structure includes a plurality of upper pad conductive layers and an upper connection layer between the plurality of upper pad conductive layers, the upper connection layer includes a conductive pattern having a shape different from a shape of at least one of the upper pad conductive layers, and the via plug is in direct contact with the upper pad conductive layers and the upper connection layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
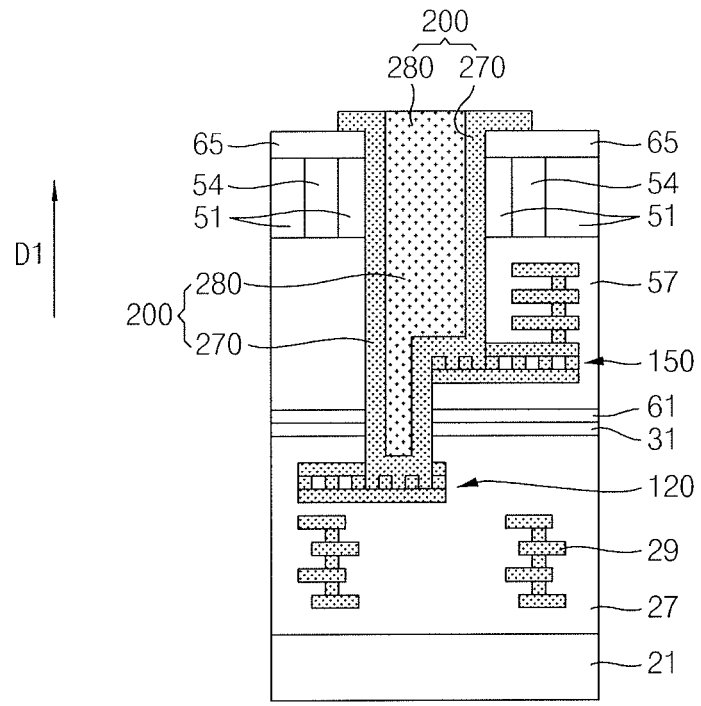
FIG. 1 illustrates an embodiment of a semiconductor device.

FIG. 1 illustrates a cross-sectional view of an embodiment of a semiconductor device, which, for example, may be a stacked semiconductor device, e.g., stacked along a first direction D1.

Referring to FIG. 1, the semiconductor device may include a lower substrate 21, a lower insulating layer 27, a plurality of lower interconnection structures 29, a lower pad structure 120, a lower bonding layer 31, an upper substrate 51, a via isolation layer 54, an upper insulating layer 57, an upper pad structure 150, an upper bonding layer 61, an upper capping layer 65, and a via plug 200. The via plug 200 may include a via conductive layer 270 and a core pattern 280. In an embodiment, the via plug 200, the lower pad structure 120, the upper pad structure 150, and related configurations may be employed in a backside via stack (BVS) product.

In an embodiment, the upper substrate 51 may be on the lower substrate 21. The lower insulating layer 27 may be between the lower substrate 21 and the upper substrate 51. The plurality of lower interconnection structures 29 and the lower pad structure 120 may be formed in the lower insulating layer 27. The lower bonding layer 31 may be between the lower insulating layer 27 and the upper substrate 51. The upper bonding layer 61 may be between the lower bonding layer 31 and the upper substrate 51. The upper insulating layer 57 may be between the upper bonding layer 61 and the upper substrate 51. The upper pad structure 150 may be formed in the upper insulating layer 57. The via isolation layer 54 passing through the upper substrate 51 may be formed. The upper capping layer 65 may be formed to cover the upper substrate 51 and the via isolation layer 54. The via plug 200 may pass through the upper capping layer 65, the upper substrate 51, the upper insulating layer 57, the upper bonding layer 61, the lower bonding layer 31, and the lower insulating layer 27 and may be in contact with the upper pad structure 150 and the lower pad structure 120. The upper substrate 51 may remain between the via plug 200 and the via isolation layer 54.

Figure 2:
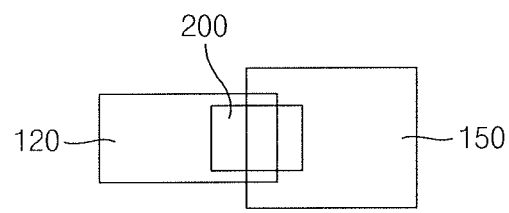
FIGS. 2 to 4 illustrate layout embodiments of semiconductor devices.
Figure 3:
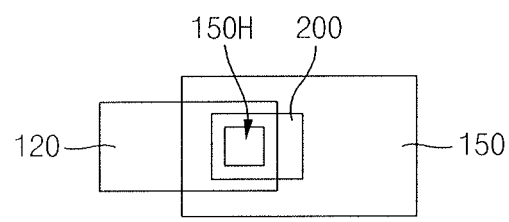
Figure 4:
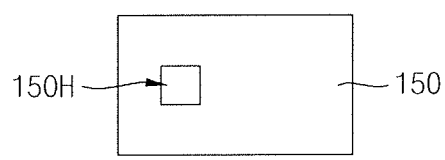

FIGS. 2 and 3 illustrate layout embodiments of semiconductor devices, and FIG. 4 illustrates a layout embodiment of a portion of FIG. 3.

Referring to FIG. 2, a lower pad structure 120 may partially overlap an upper pad structure 150. A via plug 200 may overlap the lower pad structure 120 and the upper pad structure 150. In an embodiment, the via plug 200 may partially overlap the lower pad structure 120, and the via plug 200 may partially overlap the upper pad structure 150. The lower pad structure 120 may be adjacent to the upper pad structure 150.

Referring to FIG. 3, a lower pad structure 120 may partially overlap an upper pad structure 150. A via plug 200 may overlap the lower pad structure 120 and the upper pad structure 150. A pad hole 150H may be formed to pass through the upper pad structure 150. The pad hole 150H may overlap the via plug 200 and the lower pad structure 120.

Referring to FIG. 4, the pad hole 150H may be formed to pass through the upper pad structure 150. The pad hole 150H may be formed to have a rectangular shape, a polygonal shape, a circular shape, combinations thereof, or another shape. In an embodiment, multiple pad holes 150H may be formed at various locations.

Figure 5:
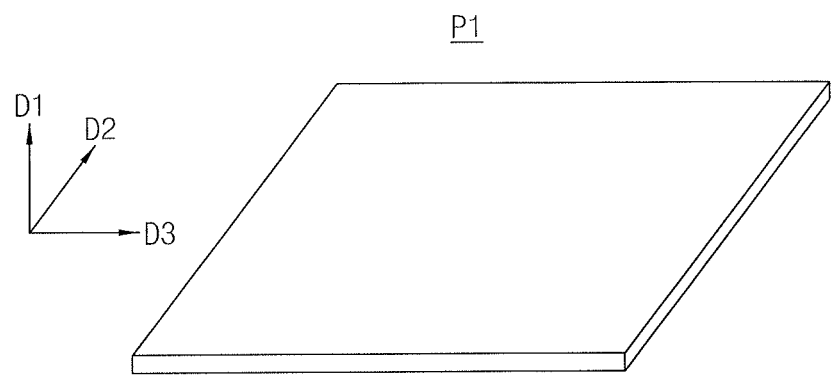
FIGS. 5 to 15 illustrate embodiments of conductive patterns.
Figure 6:
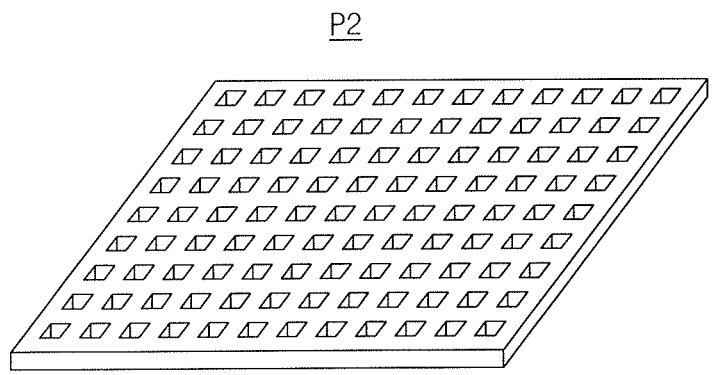
Figure 7:
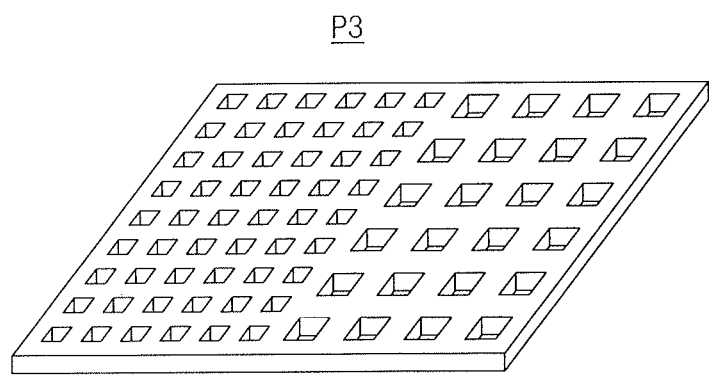

FIGS. 5 to 15 illustrate perspective views of embodiments of conductive patterns. Referring to FIG. 5, a conductive pattern P1 may include a flat plate, e.g., extending in second and third directions D2, D3, orthogonal to the first direction D1. Referring to FIG. 6, a conductive pattern P2 may include a lattice, i.e., a flat plate with holes or spaces therein. These holes may have uniform sizes and spacing. Referring to FIG. 7, a conductive pattern P3 may include a lattice with holes having various sizes and/or at various intervals, and may include a porous material layer or a mesh pattern.

Figure 8:
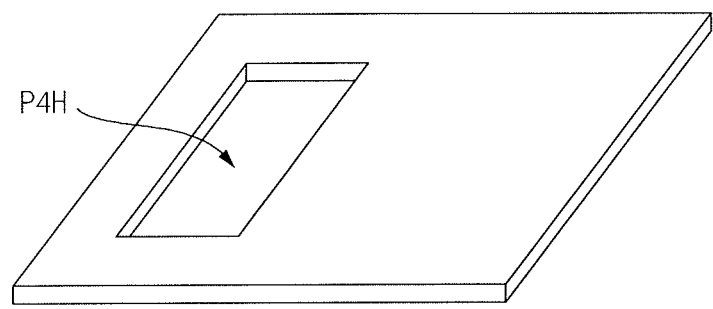

Referring to FIG. 8, a conductive pattern P4 may include a flat plate having a through hole P4H. The through hole P4H may have a rectangular shape, a polygonal shape, a circular shape, combinations thereof, or another shape. In an embodiment, the through hole P4H may correspond to the pad hole 150H of FIG. 4. Multiple through holes P4H may be formed at various locations.

Figure 9:
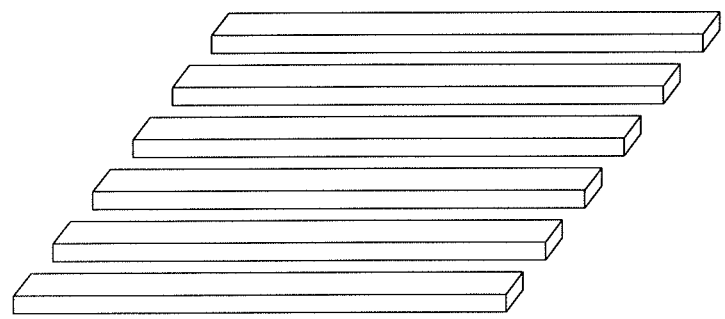
Figure 10:
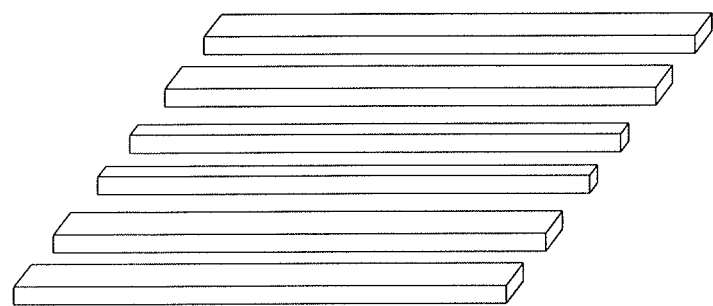

Referring to FIG. 9, a conductive pattern P5 may include a plurality of parallel bars. In an embodiment, the conductive pattern P5 may be interpreted as a bar and space shape. The bars may have a same width, e.g., along the second direction D2, and length, e.g., along the third direction D3, and may be evenly spaced. Referring to FIG. 10, a conductive pattern P6 may include a plurality of parallel bars having various sizes, e.g., different widths along the second direction D2, and/or intervals there between.

Figure 11:
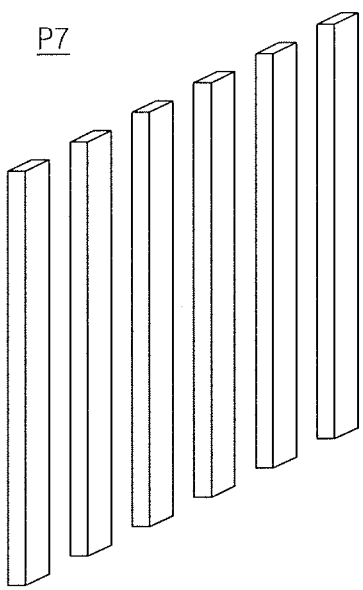

Referring to FIG. 11, a conductive pattern P7 may include a plurality of parallel bars arranged in various directions. The bars may extend along the first direction D1.

Figure 12:
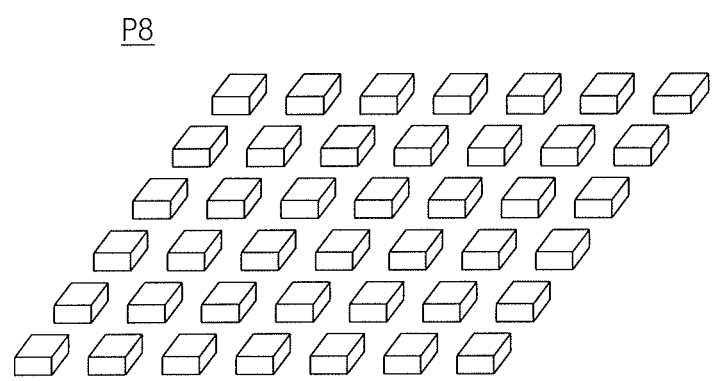
Figure 13:
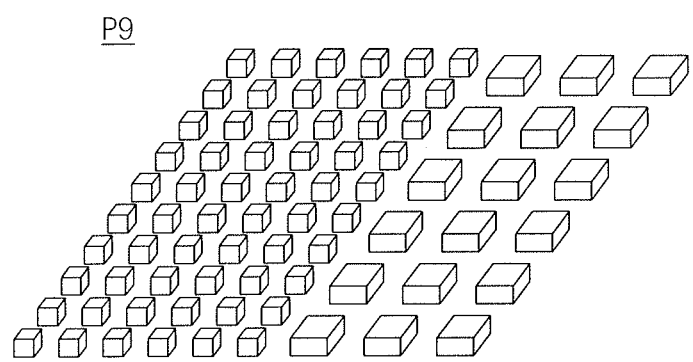

Referring to FIG. 12, a conductive pattern P8 may include a plurality of lumps. The lumps may have a definite shape. In an embodiment, the conductive pattern P8 may include a plurality of blocks arranged in row and column directions, e.g., having uniform sizes and intervals. Referring to FIG. 13, a conductive pattern P9 may include a plurality of lumps having various sizes and intervals. The conductive pattern P9 may include blocks having a hexagonal shape, and/or spherical shape, a hemispherical shape, a cylindrical shape, a polygonal shape, combinations thereof, or another shape.

Figure 14:
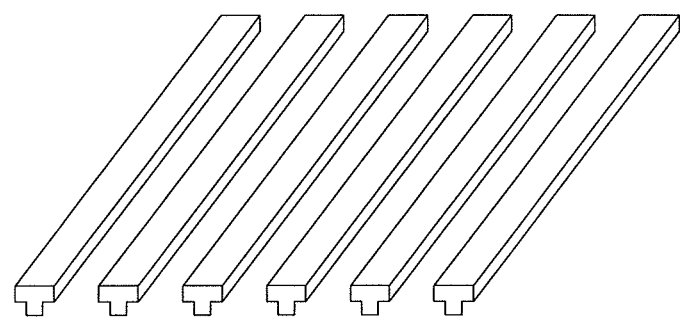

Referring to FIG. 14, a conductive pattern P10 may include a plurality of parallel rods. Each of the rods may have a shape in which an upper rod is coupled to a lower rod, e.g., may be integral therewith. The upper rod may have a relatively wider width than the lower rod. In an embodiment, each of the rods may have a shape in which a plurality of blocks are coupled to a lower surface of the upper rod.

Figure 15:
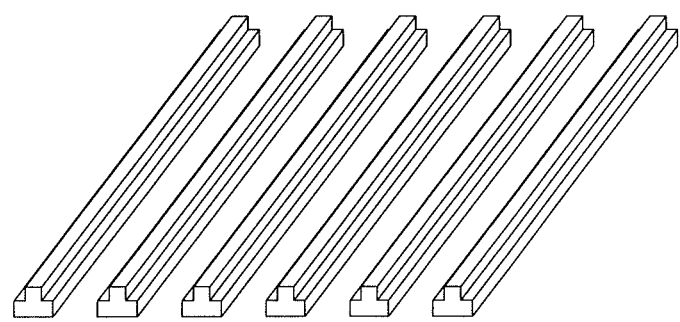

Referring to FIG. 15, a conductive pattern P11 may include a plurality of parallel rods. Each of the rods may have a shape in which an upper rod is coupled to a lower rod, e.g., may be integral therewith. The upper rod may have a relatively narrower width than the lower rod.

In an embodiment, the conductive patterns P1 to P11 described with reference to FIGS. 5 to 15 may be partially or fully coupled to each other in various ways. The conductive patterns P1 to P11 may include a conductive material, e.g., a metal, a metal nitride, a metal oxide, a metal silicide, polysilicon, a conductive carbon, or a combination thereof.

FIGS. 16 to 24 are cross-sectional views illustrating embodiments of semiconductor devices. In an embodiment, each of the portions of FIGS. 16 to 24 may correspond to a portion of FIG. 1.

Figure 16:
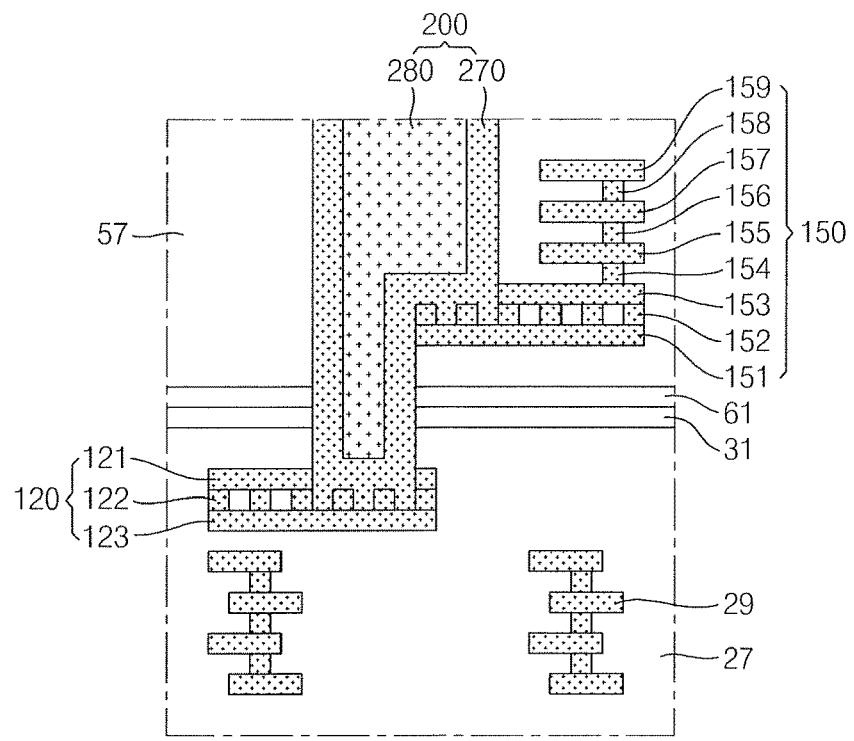
FIGS. 16 to 24 illustrate embodiments of semiconductor devices.

Referring to FIG. 16, a lower bonding layer 31 and an upper bonding layer 61 may be between a lower insulating layer 27 and an upper insulating layer 57. Lower interconnection structures 29 and a lower pad structure 120 may be formed in the lower insulating layer 27. The lower pad structure 120 may include a plurality of lower pad conductive layers 121 and 123 and a first lower connection layer 122. The lower bonding layer 31 may be on the lower insulating layer 27. The upper bonding layer 61 may be bonded to the lower bonding layer 31. The upper insulating layer 57 may be on the upper bonding layer 61. An upper pad structure 150 may be formed in the upper insulating layer 57 and may include a plurality of upper pad conductive layers 151, 153, 155, 157, and 159 and a plurality of upper connection layers 152, 154, 156, and 158.

A via plug 200 may be formed to pass through the upper insulating layer 57, the upper bonding layer 61, the lower bonding layer 31, and the lower insulating layer 27 and may be connected to the upper pad structure 150 and the lower pad structure 120. The via plug 200 may include a via conductive layer 270 and a core pattern 280.

The plurality of lower pad conductive layers 121 and 123 may include a first lower pad conductive layer 121 and a second lower pad conductive layer 123 at a lower level than the first lower pad conductive layer 121. The first lower connection layer 122 may be between the first lower pad conductive layer 121 and the second lower pad conductive layer 123. The first lower connection layer 122 may be in direct contact with the first lower pad conductive layer 121 and the second lower pad conductive layer 123. The via plug 200 may pass through the first lower pad conductive layer 121 and may be in direct contact with a side surface of the first lower pad conductive layer 121, an upper surface and a side surface of the first lower connection layer 122, and an upper surface of the second lower pad conductive layer 123. In an embodiment, the via conductive layer 270 may be in direct contact with the side surface of the first lower pad conductive layer 121, the upper surface and the side surface of the first lower connection layer 122, and the upper surface of the second lower pad conductive layer 123.

The plurality of upper pad conductive layers 151, 153, 155, 157, and 159 may include a first upper pad conductive layer 151, a second upper pad conductive layer 153 on the first upper pad conductive layer 151, a third upper pad conductive layer 155 on the second upper pad conductive layer 153, a fourth upper pad conductive layer 157 on the third upper pad conductive layer 155, and a fifth upper pad conductive layer 159 on the fourth upper pad conductive layer 157. The plurality of upper connection layers 152, 154, 156, and 158 may include a first upper connection layer 152 between the first upper pad conductive layer 151 and the second upper pad conductive layer 153, a second upper connection layer 154 between the second upper pad conductive layer 153 and the third upper pad conductive layer 155, a third upper connection layer 156 between the third upper pad conductive layer 155 and the fourth upper pad conductive layer 157, and a fourth upper connection layer 158 between the fourth upper pad conductive layer 157 and the fifth upper pad conductive layer 159. The first upper connection layer 152 may be in direct contact with the first upper pad conductive layer 151 and the second upper pad conductive layer 153.

The via plug 200 may partially pass through the second upper pad conductive layer 153. The via plug 200 may be in direct contact with a side surface of the second upper pad conductive layer 153, an upper surface and a side surface of the first upper connection layer 152, and an upper surface of and a side surface of the first upper pad conductive layer 151. In an embodiment, the via conductive layer 270 may be in direct contact with the side surface of the second upper pad conductive layer 153, the upper surface and the side surface of the first upper connection layer 152, and the upper surface and the side surface of the first upper pad conductive layer 151.

Each of the plurality of lower pad conductive layers 121 and 123, the first lower connection layer 122, the plurality of upper pad conductive layers 151, 153, 155, 157, and 159, and the plurality of upper connection layers 152, 154, 156, and 158 may include at least one of the conductive patterns P1 to P11, for example, as described with reference to FIGS. 5 to 15. In an embodiment, the lower insulating layer 27 or the upper insulating layer 57 may be inside the conductive patterns P1 to P11. For example, the lower insulating layer 27 may be partially inside the first lower connection layer 122. The upper insulating layer 57 may be partially inside the first upper connection layer 152.

Each of the second upper connection layer 154, the third upper connection layer 156, and the fourth upper connection layer 158 may include a conductive pattern having a shape different from that of the first upper connection layer 152. The first lower connection layer 122 may include a conductive pattern having a shape different from that of at least one of the plurality of lower pad conductive layers 121 and 123. The first upper connection layer 152 may include a conductive pattern having a shape different from that of at least one of the plurality of upper pad conductive layers 151, 153, 155, 157, and 159. The first upper connection layer 152 may include a conductive pattern having a shape different from that of at least one of the first upper pad conductive layer 151 and the second upper pad conductive layer 153.

In an embodiment, the first lower connection layer 122 may correspond to a lower connection layer. The first upper connection layer 152 may correspond to an upper connection layer. In one embodiment, at least one of the lower bonding layer 31 and the upper bonding layer 61 may be omitted.

A contact area between the via plug 200 and the upper pad structure 150 may be significantly larger than that of other devices, and a contact area between the via plug 200 and the lower pad structure 120 may also be significantly larger than that of other devices. An electrical contact resistance between the via plug 200 and the upper pad structure 150, and an electrical contact resistance between the via plug 200 and the lower pad structure 120, may be significantly reduced.

Referring again to FIGS. 2 and 16, a portion of the via plug 200 may be interpreted as a portion which overlaps the first upper connection layer 152. The portion of the via plug 200 may be interpreted as a portion which overlaps the first lower connection layer 122.

Figure 17:
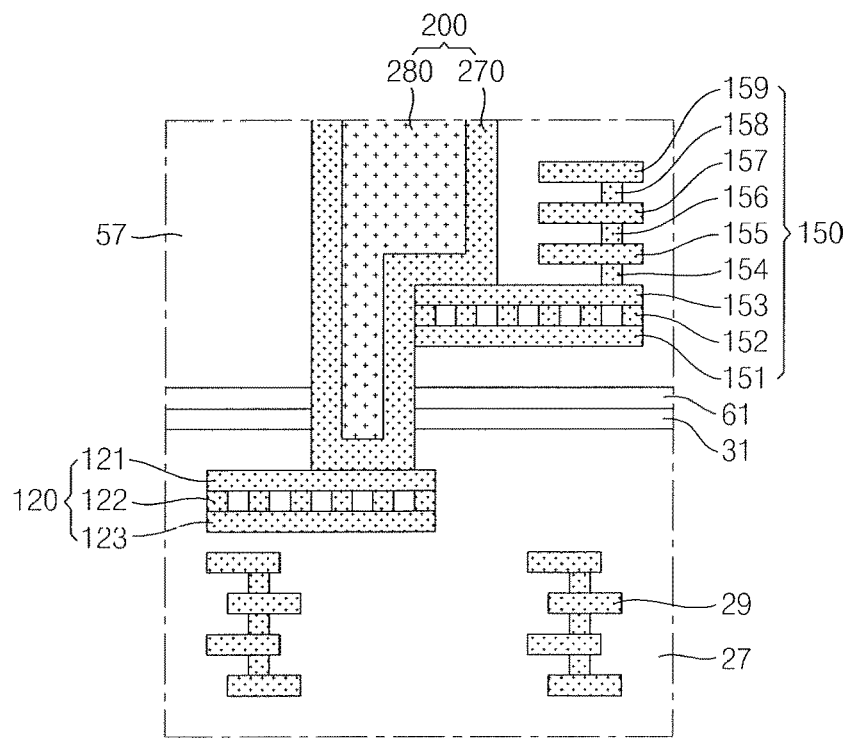

Referring to FIG. 17, a via plug 200 may be in direct contact with an upper surface and a side surface of a second upper pad conductive layer 153, a side surface of a first upper connection layer 152, and a side surface of a first upper pad conductive layer 151. In an embodiment, a via conductive layer 270 may be in direct contact with the upper surface and the side surface of the second upper pad conductive layer 153, the side surface of the first upper connection layer 152, and the side surface of the first upper pad conductive layer 151. The via plug 200 may be in direct contact with an upper surface of a first lower pad conductive layer 121. In an embodiment, the via conductive layer 270 may be in direct contact with the upper surface of the first lower pad conductive layer 121.

Figure 18:
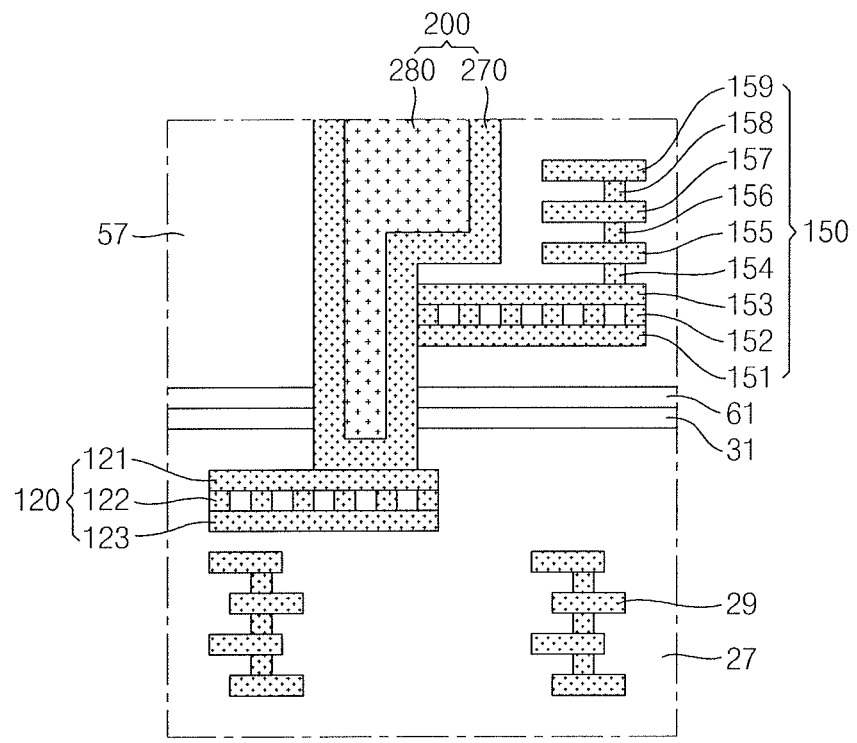

Referring to FIG. 18, a via plug 200 may be in direct contact with a side surface of a second upper pad conductive layer 153, a side surface of a first upper connection layer 152, and a side surface of a first upper pad conductive layer 151. In an embodiment, a via conductive layer 270 may be in direct contact with the side surface of the second upper pad conductive layer 153, the side surface of the first upper connection layer 152, and the side surface of the first upper pad conductive layer 151. The via plug 200 may be in direct contact with an upper surface of a first lower pad conductive layer 121.

Figure 19:
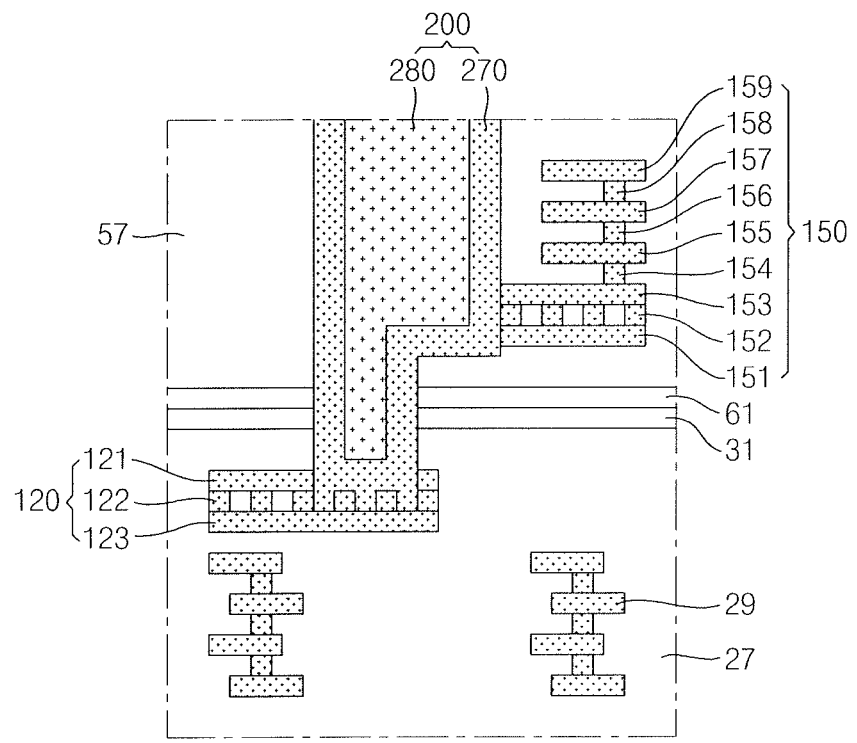

Referring to FIG. 19, a via plug 200 may partially pass through a second upper pad conductive layer 153, a first upper connection layer 152, and a first upper pad conductive layer 151. The via plug 200 may be in direct contact with a side surface of the second upper pad conductive layer 153, a side surface of the first upper connection layer 152, and a side surface of the first upper pad conductive layer 151. In an embodiment, a via conductive layer 270 may be in direct contact with the side surface of the second upper pad conductive layer 153, the side surface of the first upper connection layer 152, and the side surface of the first upper pad conductive layer 151.

The via plug 200 may pass through a first lower pad conductive layer 121. The via plug 200 may be in direct contact with a side surface of the first lower pad conductive layer 121, an upper surface and a side surface of a first lower connection layer 122, and an upper surface of a second lower pad conductive layer 123. In an embodiment, the via conductive layer 270 may be in direct contact with the side surface of the first lower pad conductive layer 121, the upper surface and the side surface of the first lower connection layer 122, and the upper surface of the second lower pad conductive layer 123.

Figure 20:
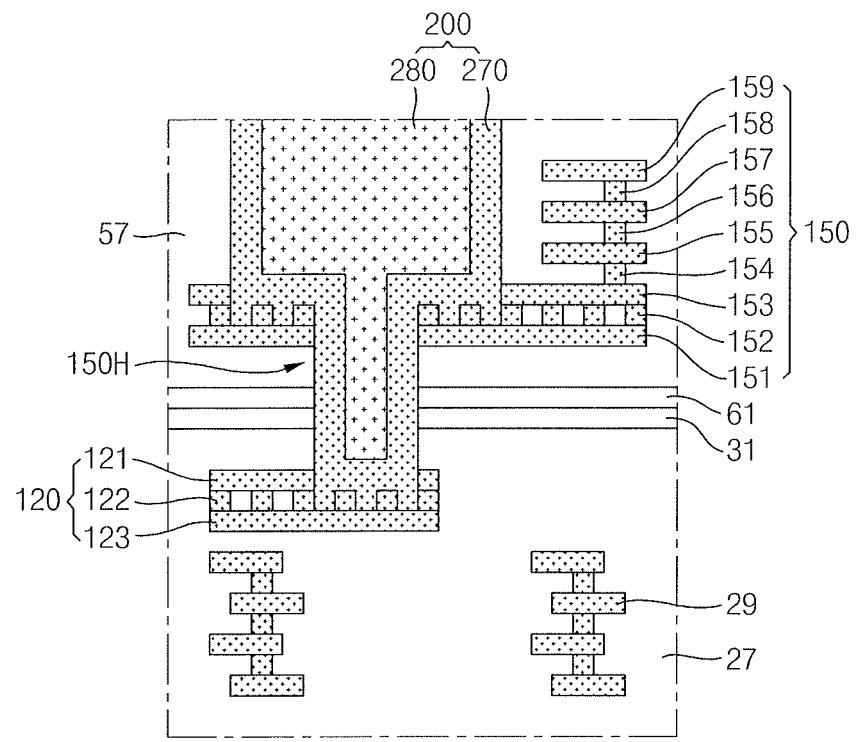

Referring to FIG. 20, a pad hole 150H may be formed to pass through an upper pad structure 150. A portion of a via plug 200 may be formed in the pad hole 150H, and the via plug 200 may pass through the upper pad structure 150.

The via plug 200 may partially pass through a second upper pad conductive layer 153, a first upper connection layer 152, and a first upper pad conductive layer 151. The via plug 200 may be in direct contact with a side surface of the second upper pad conductive layer 153, an upper surface and a side surface of the first upper connection layer 152, and an upper surface and a side surface of the first upper pad conductive layer 151. In an embodiment, a via conductive layer 270 may be in direct contact with the side surface of the second upper pad conductive layer 153, the upper surface and the side surface of the first upper connection layer 152, and the upper surface and the side surface of the first upper pad conductive layer 151.

Referring again to FIGS. 3 and 20, a portion of the via plug 200 may be interpreted as a portion which overlaps the first upper connection layer 152. The portion of the via plug 200 may be interpreted as a portion which overlaps the first lower connection layer 122.

Figure 21:
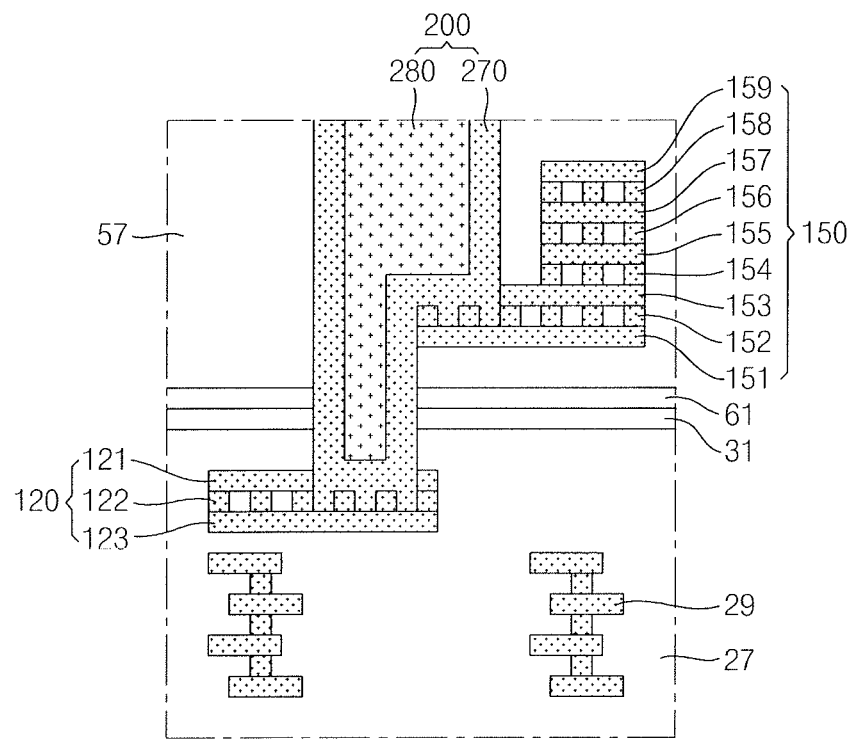

Referring to FIG. 21, a second upper connection layer 154, a third upper connection layer 156, and a fourth upper connection layer 158 may include a pattern similar to a first upper connection layer 152.

Figure 22:
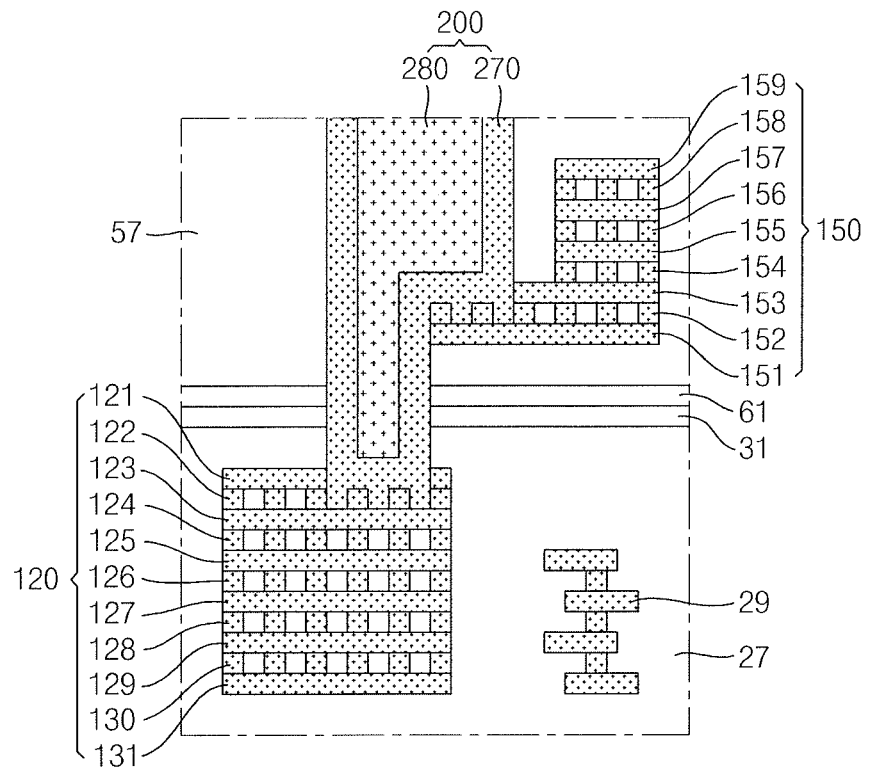

Referring to FIG. 22, lower interconnection structures 29 and a lower pad structure 120 may be formed in a lower insulating layer 27. The lower pad structure 120 may include a plurality of lower pad conductive layers 121, 123, 125, 127, 129, and 131 and a plurality of lower connection layers 122, 124, 126, 128, and 130. A lower bonding layer 31 may be formed on the lower insulating layer 27. An upper bonding layer 61 may be bonded to the lower bonding layer 31. An upper insulating layer 57 may be formed on the upper bonding layer 61. An upper pad structure 150 may be formed in the upper insulating layer 57. The upper pad structure 150 may include a plurality of upper pad conductive layers 151, 153, 155, 157, and 159 and a plurality of upper connection layers 152, 154, 156, and 158.

A via plug 200 may be formed to pass through the upper insulating layer 57, the upper bonding layer 61, the lower bonding layer 31, and the lower insulating layer 27 and may be connected to the upper pad structure 150 and the lower pad structure 120. The via plug 200 may include a via conductive layer 270 and a core pattern 280.

The plurality of lower pad conductive layers 121, 123, 125, 127, 129, and 131 may include a first lower pad conductive layer 121, a second lower pad conductive layer 123, a third lower pad conductive layer 125, a fourth lower pad conductive layer 127, a fifth lower pad conductive layer 129, and a sixth lower pad conductive layer 131. The plurality of lower connection layers 122, 124, 126, 128, and 130 may include a first lower connection layer 122, a second lower connection layer 124, a third lower connection layer 126, a fourth lower connection layer 128, and a fifth lower connection layer 130. The plurality of upper pad conductive layers 151, 153, 155, 157, and 159 may include a first upper pad conductive layer 151, a second upper pad conductive layer 153, a third upper pad conductive layer 155, a fourth upper pad conductive layer 157, and a fifth upper pad conductive layer 159. The plurality of upper connection layers 152, 154, 156, and 158 may include a first upper connection layer 152, a second upper connection layer 154, a third upper connection layer 156, and a fourth upper connection layer 158.

Each of the plurality of lower pad conductive layers 121, 123, 125, 127, 129, and 131, the plurality of lower connection layers 122, 124, 126, 128, and 130, the plurality of upper pad conductive layers 151, 153, 155, 157, and 159, and the plurality of upper connection layers 152, 154, 156, and 158 may include at least one of the conductive patterns P1 to P11, for example, as described with reference to FIGS. 5 to 15.

Figure 23:
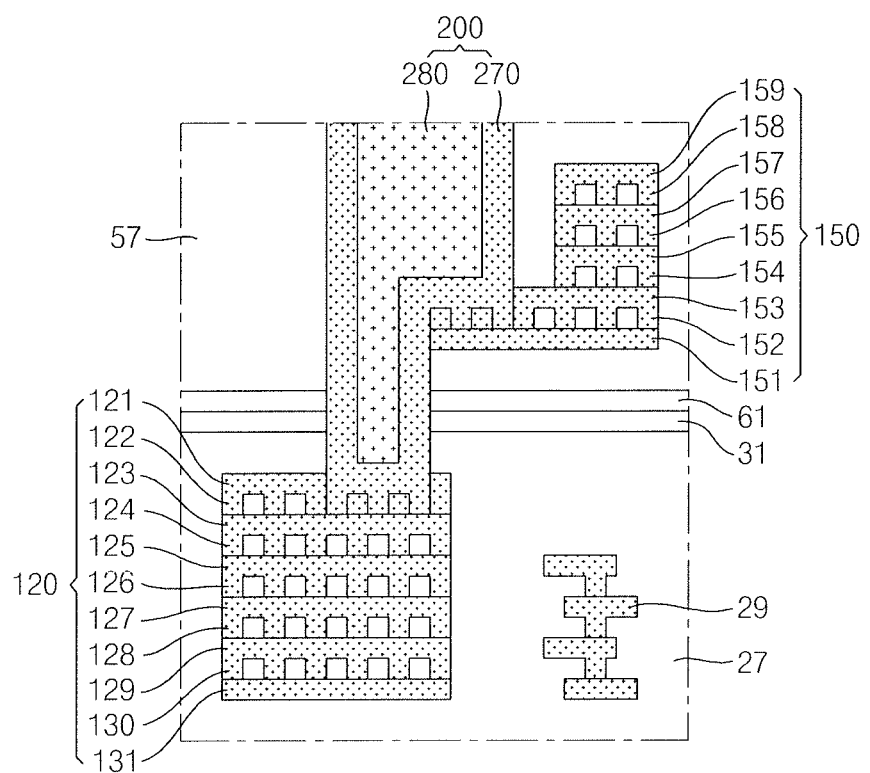

Referring to FIG. 23, a first upper connection layer 152 may be materially continuous with a second upper pad conductive layer 153. A second upper connection layer 154 may be materially continuous with a third upper pad conductive layer 155. A third upper connection layer 156 may be materially continuous with a fourth upper pad conductive layer 157. A fourth upper connection layer 158 may be materially continuous with a fifth upper pad conductive layer 159. A first lower connection layer 122 may be materially continuous with a first lower pad conductive layer 121. A second lower connection layer 124 may be materially continuous with a second lower pad conductive layer 123. A third lower connection layer 126 may be materially continuous with a third lower pad conductive layer 125. A fourth lower connection layer 128 may be materially continuous with a fourth lower pad conductive layer 127. A fifth lower connection layer 130 may be materially continuous with a fifth lower pad conductive layer 129.

Figure 24:
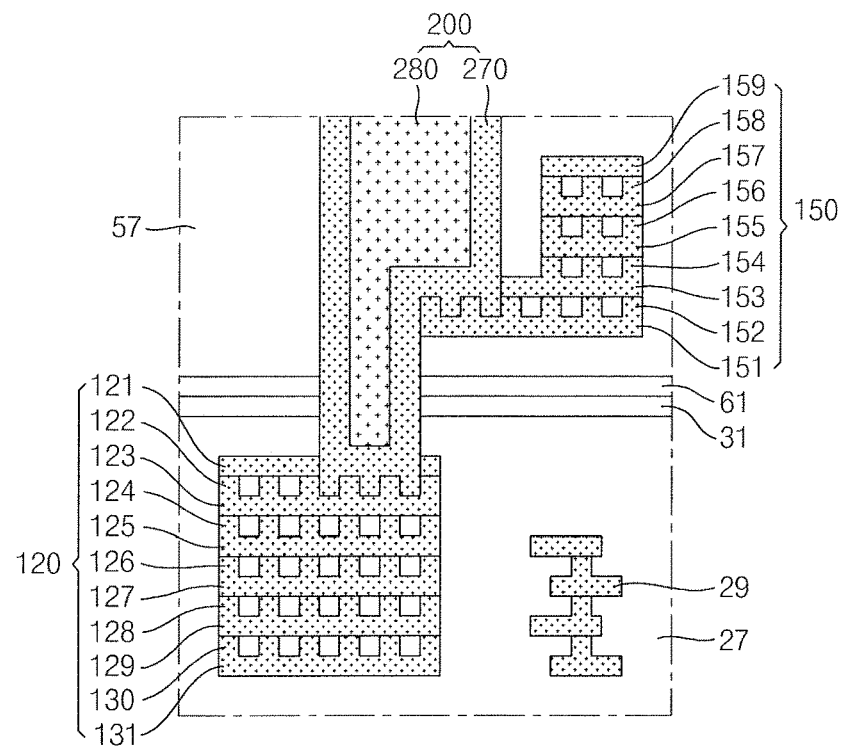

Referring to FIG. 24, a first upper connection layer 152 may be materially continuous with a first upper pad conductive layer 151. A second upper connection layer 154 may be materially continuous with a second upper pad conductive layer 153. A third upper connection layer 156 may be materially continuous with a third upper pad conductive layer 155. A fourth upper connection layer 158 may be materially continuous with a fourth upper pad conductive layer 157.

A first lower connection layer 122 may be materially continuous with a second lower pad conductive layer 123. A second lower connection layer 124 may be materially continuous with a third lower pad conductive layer 125. A third lower connection layer 126 may be materially continuous with a fourth lower pad conductive layer 127. A fourth lower connection layer 128 may be materially continuous with a fifth lower pad conductive layer 129. A fifth lower connection layer 130 may be materially continuous with a sixth lower pad conductive layer 131.

Figure 25:
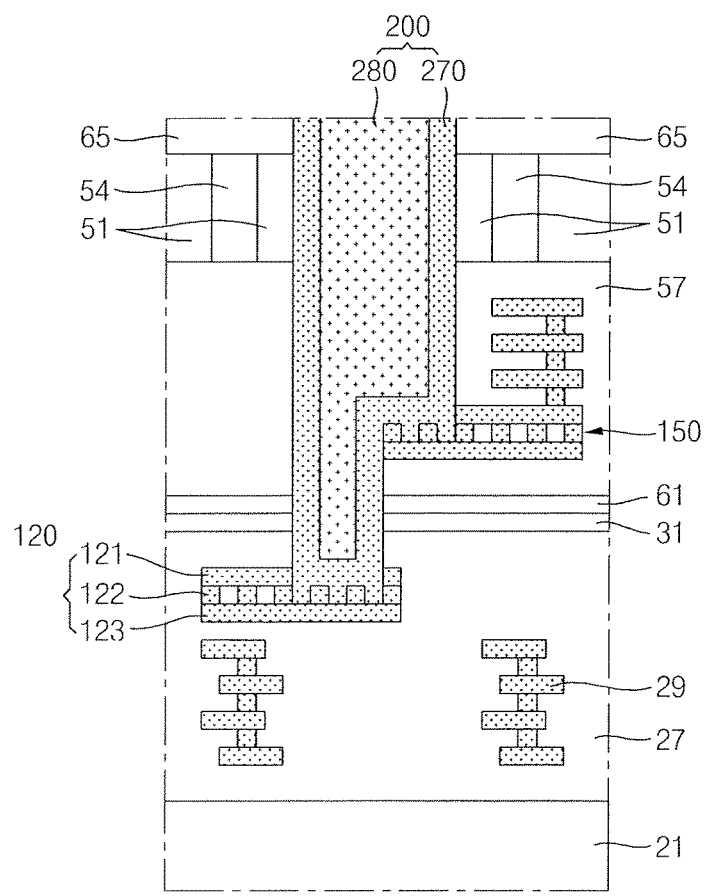
FIG. 25 illustrates another embodiment of a semiconductor device.

FIG. 25 illustrates a cross-sectional view of another embodiment of a semiconductor device. Referring to FIG. 25, upper surfaces of an upper capping layer 65 and a via plug 200 may be substantially coplanar. The upper surface of the upper capping layer 65 and upper surfaces of a via conductive layer 270 and a core pattern 280 may be substantially coplanar.

Figure 26:
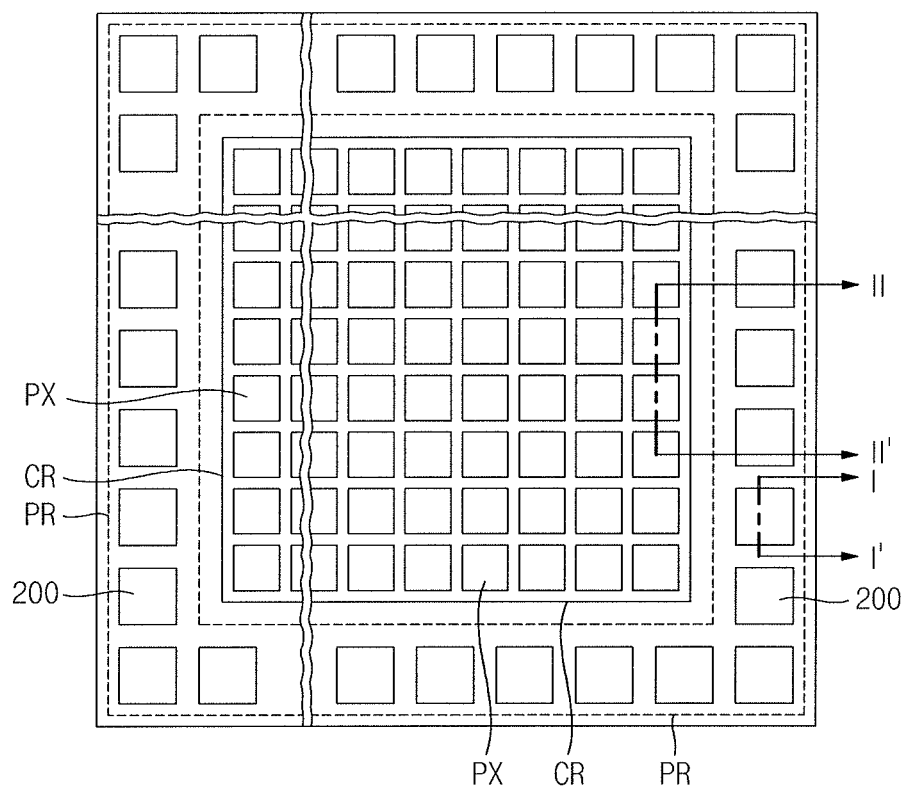
FIG. 26 illustrates additional layout embodiments of a semiconductor device.
Figure 27:
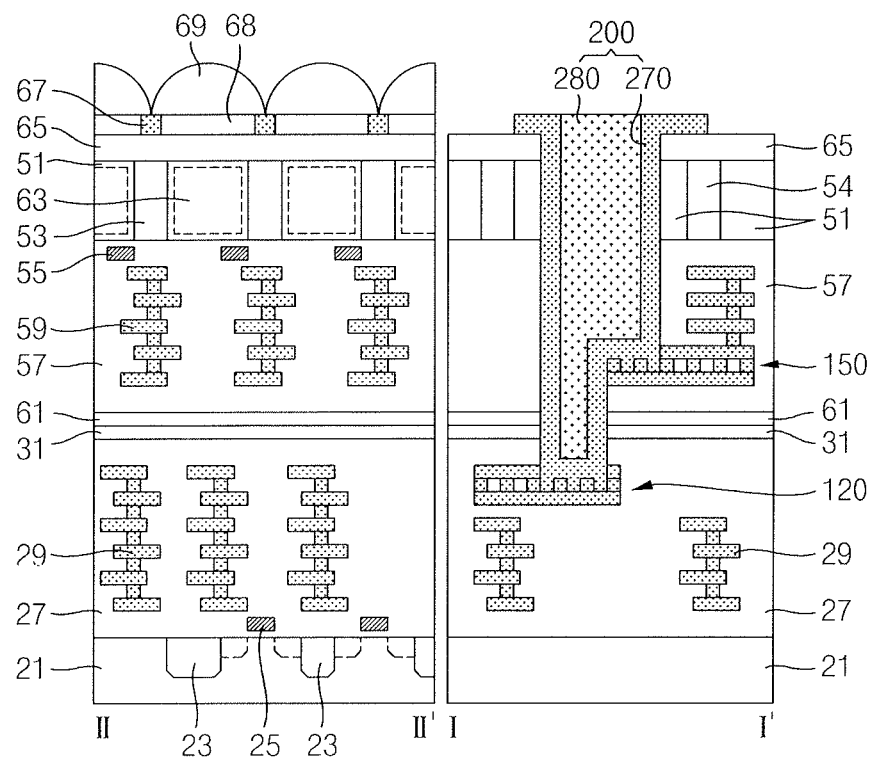
FIG. 27 illustrates another embodiment of a semiconductor device.

FIG. 26 illustrates another layout embodiment of a semiconductor device, and FIG. 27 illustrates a view taken along section lines I-I' and II-II' in FIG. 26. In an embodiment, the semiconductor device may include a back side illumination (BSI) image sensor. The semiconductor device may include a cell region CR and a via region PR adjacent to the cell region CR. In an embodiment, the cell region CR may include a plurality of pixels PX. The via region PR may include a plurality of via plugs 200.

Referring to FIGS. 26 and 27, the semiconductor device may include a lower substrate 21, a lower element isolation layer 23, lower gate electrodes 25, a lower insulating layer 27, lower interconnection structures 29, a lower pad structure 120, a lower bonding layer 31, an upper substrate 51, an upper element isolation layer 53, a via isolation layer 54, upper gate electrodes 55, an upper insulating layer 57, upper interconnection structures 59, an upper pad structure 150, an upper bonding layer 61, a plurality of photodiodes 63, an upper capping layer 65, a light shielding pattern 67, a plurality of color filters 68, a plurality of micro lenses 69, and a via plug 200. The via plug 200 may include a via conductive layer 270 and a core pattern 280. The plurality of photodiodes 63, the plurality of color filters 68, and the plurality of micro lenses 69 may constitute the plurality of pixels PX.

In an embodiment, the upper substrate 51 may be on the lower substrate 21. The lower element isolation layer 23 may be formed in the lower substrate 21 in the cell region CR. The lower gate electrodes 25 may be on the lower substrate 21 in the cell region CR. The lower insulating layer 27 may be between the lower substrate 21 and the upper substrate 51. The plurality of lower interconnection structures 29 and the lower pad structure 120 may be formed in the lower insulating layer 27. The lower pad structure 120 may be in the via region PR. The lower bonding layer 31 may be between the lower insulating layer 27 and the upper substrate 51.

The upper bonding layer 61 may be between the lower bonding layer 31 and the upper substrate 51. The upper insulating layer 57 may be between the upper bonding layer 61 and the upper substrate 51. The upper gate electrodes 55, the upper interconnection structures 59, and the upper pad structure 150 may be formed in the upper insulating layer 57. The upper pad structure 150 may be in the via region PR. The plurality of photodiodes 63 may be formed in the upper substrate 51. The upper element isolation layer 53 may pass through the upper substrate 51 and may be between the plurality of photodiodes 63. The plurality of photodiodes 63 and the upper element isolation layer 53 may be in the cell region CR.

The via isolation layer 54 may be formed to pass through the upper substrate 51. The upper capping layer 65 may be formed to cover the upper substrate 51, the upper element isolation layer 53, and the via isolation layer 54. The via plug 200 may be formed to pass through the upper capping layer 65, the upper substrate 51, the upper insulating layer 57, the upper bonding layer 61, the lower bonding layer 31, and the lower insulating layer 27 and may be in contact with the upper pad structure 150 and the lower pad structure 120. The light shielding pattern 67 and the plurality of color filters 68 may be on the upper capping layer 65 in the cell region CR. The plurality of micro lenses 69 may be on the plurality of color filters 68.

In an embodiment, the lower insulating layer 27, the lower bonding layer 31, the upper bonding layer 61, the upper insulating layer 57, the upper substrate 51, and the upper capping layer 65 may be interpreted as being sequentially stacked on the lower substrate 21.

FIGS. 28 to 36 illustrates views taken along section lines I-I' and II-II' of FIG. 26, and correspond to various stages of a method for forming a semiconductor device according to an exemplary embodiment.

Figure 28:
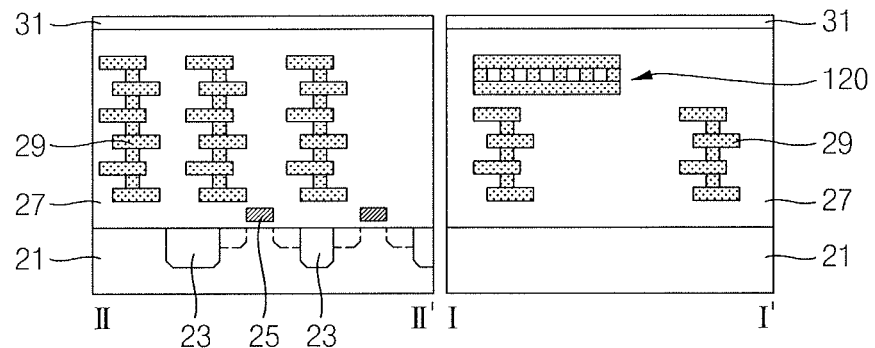
FIGS. 28 to 40 illustrate various stages of a method for forming a semiconductor device according to an exemplary embodiment.

Referring to FIGS. 26 and 28, the method may include forming the lower substrate 21, the lower element isolation layer 23, the lower gate electrodes 25, the lower insulating layer 27, the lower interconnection structures 29, the lower pad structure 120 and the lower bonding layer 31. The lower gate electrodes 25 may be formed in the cell region CR. The lower gate electrodes 25 and the lower interconnection structures 29 may constitute various logic circuits. The lower pad structure 120 may be formed in the via region PR. In an embodiment, the cell region CR of the lower substrate 21 may include various types of semiconductor devices. Examples include volatile memory devices, non-volatile memory devices, or combinations thereof.

The lower substrate 21 may include a semiconductor substrate such as a silicon wafer or a silicon on insulator (SOI) wafer. The lower element isolation layer 23 may be formed in the lower substrate 21 using a shallow trench isolation (STI) method. The lower element isolation layer 23 may include an insulating material. e.g., silicon oxide, silicon nitride, silicon oxynitride, silicon oxycarbonitride (SiOCN), or a combination thereof. The lower gate electrodes 25 may be formed on the lower substrate 21. Each of the lower gate electrodes 25 may be part of a transistor. The lower gate electrodes 25 may include a conductive material, e.g., a metal, a metal oxide, a metal nitride, a metal silicide, polysilicon, a conductive carbon, or a combination thereof.

The lower insulating layer 27 may be formed to cover the lower element isolation layer 23, the lower gate electrodes 25, and the lower substrate 21. The lower insulating layer 27 is illustrated as a single layer. In another embodiment, the lower insulating layer 27 may be formed from multiple layers, e.g., a multilayer. The lower insulating layer 27 may include an insulating material, e.g., silicon oxide, silicon nitride, silicon oxynitride, silicon oxycarbonitride (SiOCN), low-k dielectrics, high-k dielectrics, or a combination thereof.

The lower interconnection structures 29 and the lower pad structure 120 may be formed in the lower insulating layer 27. The lower interconnection structures 29 may include a plurality of conductive layers and connection layers between the conductive layers. The lower pad structure 120 may include various configurations, for example, as described with reference to FIGS. 1 to 27. The lower pad structure 120 may be electrically connected to a corresponding one of the lower interconnection structures 29.

The lower interconnection structures 29 and the lower pad structure 120 may include a conductive material, e.g., a metal, a metal oxide, a metal nitride, a metal silicide, polysilicon, a conductive carbon, or a combination thereof. The lower pad structure 120 may include a material layer which is simultaneously formed with and the same as corresponding layers of the lower interconnection structures 29. In an embodiment, the lower pad structure 120 may include a material layer which is simultaneously formed with and the same as layers formed at the same level, among the lower interconnection structures 29. The lower bonding layer 31 may be formed on the lower insulating layer 27. In an embodiment, the lower bonding layer 31 may include an insulating material, e.g., silicon oxide.

Figure 29:
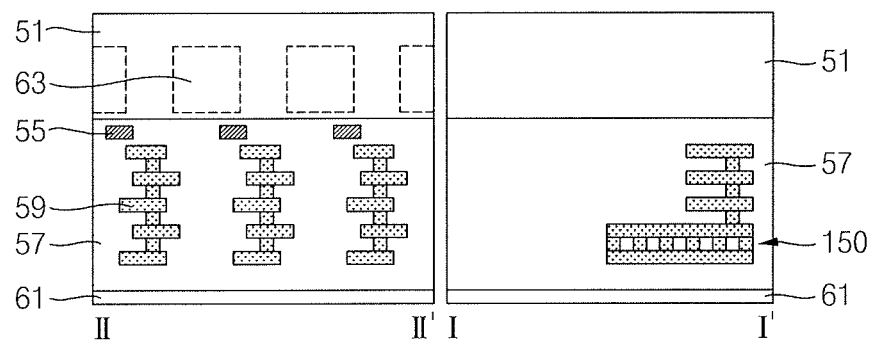

Referring to FIGS. 26 and 29, the method for forming the semiconductor device may include forming the upper substrate 51, the upper gate electrodes 55, the upper insulating layer 57, the upper interconnection structures 59, the upper pad structure 150, the upper bonding layer 61, and the plurality of photodiodes 63. The upper gate electrodes 55 and the plurality of photodiodes 63 may be formed in the cell region CR. The upper pad structure 150 may be formed in the via region PR.

The upper substrate 51 may include a semiconductor substrate such as a silicon wafer or an SOI wafer. In an embodiment, the upper substrate 51 may include a single crystalline silicon substrate containing P-type impurities. The plurality of photodiodes 63 may be formed in the upper substrate 51. Each of the plurality of photodiodes 63 may include an N-type impurity region and a P-type impurity region. The plurality of photodiodes 63 may be disposed at regular intervals. The upper gate electrodes 55 may be formed on the upper substrate 51. Each of the upper gate electrodes 55 may be part of a transistor. The upper gate electrodes 55 may include a conductive material, e.g., a metal, a metal oxide, a metal nitride, a metal silicide, polysilicon, a conductive carbon, or a combination thereof.

The upper insulating layer 57 may be formed on the upper substrate 51. The upper insulating layer 57 may cover the upper gate electrodes 55. The upper insulating layer 57 is illustrated as a single layer. In one embodiment, the upper insulating layer 57 may be a multilayer. The upper insulating layer 57 may include an insulating material, e.g., silicon oxide, silicon nitride, silicon oxynitride, silicon oxycarbonitride (SiOCN), low-k dielectrics, high-k dielectrics, or a combination thereof.

The upper interconnection structures 59 and the upper pad structure 150 may be formed in the upper insulating layer 57. The upper interconnection structures 59 may include a plurality of conductive layers and connection layers between the conductive layers. The upper pad structure 150 may include various configurations, for example, as described with reference to FIGS. 1 to 27. The upper pad structure 150 may be electrically connected to a corresponding one of the upper interconnection structures 59.

The upper interconnection structures 59 and the upper pad structure 150 may include a conductive material, e.g., a metal, a metal oxide, a metal nitride, a metal silicide, polysilicon, a conductive carbon, or a combination thereof. The upper pad structure 150 may include a material layer which is simultaneously formed with and the same as corresponding layers of the upper interconnection structures 59. In an embodiment, the upper pad structure 150 may include a material layer which is simultaneously formed with and the same as layers formed at the same level among the upper interconnection structures 59.

The upper bonding layer 61 may be formed on the upper insulating layer 57. In an embodiment, the upper bonding layer 61 may include an insulating material, e.g., silicon oxide. The upper gate electrodes 55, the upper insulating layer 57, the upper interconnection structures 59, the upper pad structure 150, and the upper bonding layer 61 are illustrated as being formed on the upper substrate 51. In an embodiment, the upper gate electrodes 55, the upper insulating layer 57, the upper interconnection structures 59, the upper pad structure 150, and the upper bonding layer 61 may be interpreted as being illustrated upside down for convenience of description.

Figure 30:
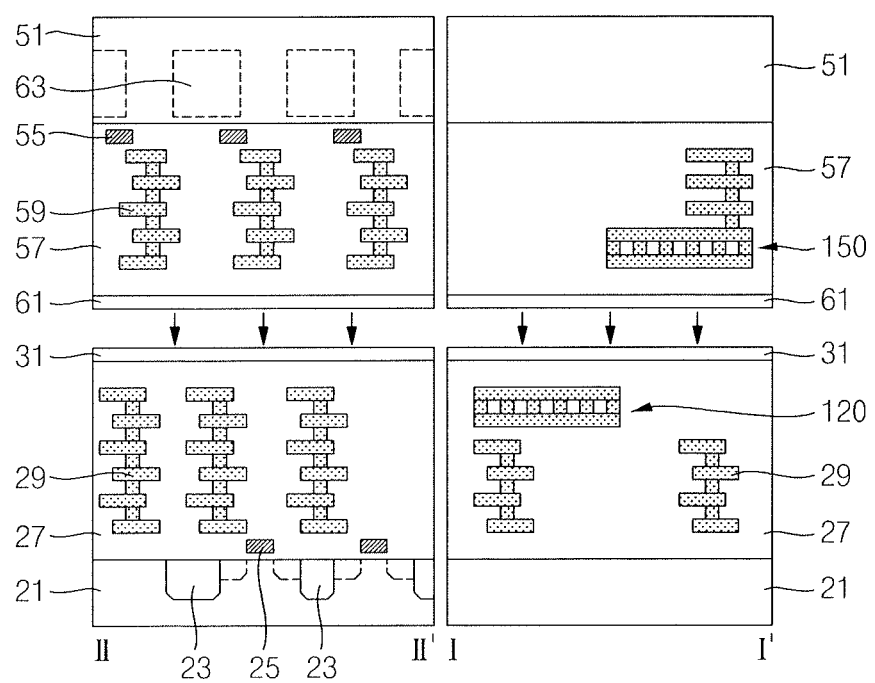

Referring to FIGS. 26 and 30, the upper bonding layer 61 may be bonded to the lower bonding layer 31. In an embodiment, the lower bonding layer 31 and the upper bonding layer 61 may be partially or fully omitted. The upper insulating layer 57 may be in direct contact with the lower insulating layer 27 or the lower bonding layer 31, or the lower insulating layer 27 may be in direct contact with the upper bonding layer 61. A process for bonding the upper bonding layer 61 onto the lower bonding layer 31 may include a plasma oxidation process.

Figure 31:
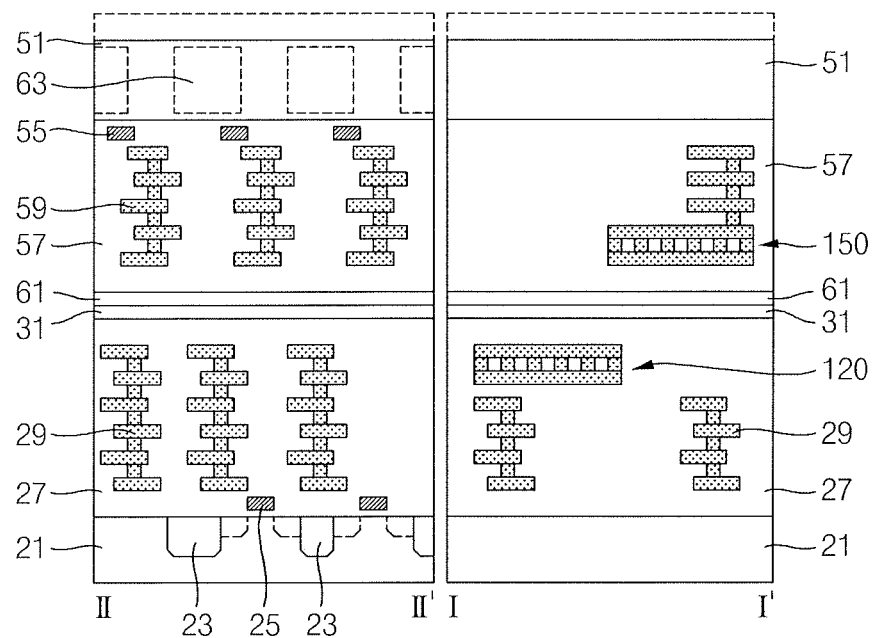

Referring to FIGS. 26 and 31, one surface of the upper substrate 51 may be recessed to reduce a thickness of the upper substrate 51.

Figure 32:
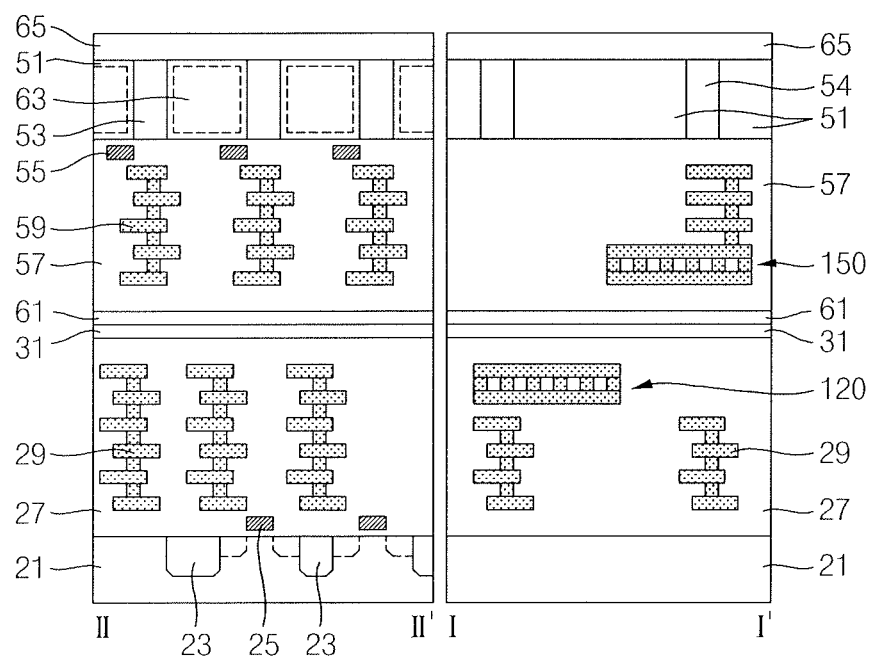

Referring to FIGS. 26 and 32, the upper element isolation layer 53 and the via isolation layer 54 may be formed in the upper substrate 51. The upper capping layer 65 may be formed to cover the upper substrate 51, the upper element isolation layer 53, and the via isolation layer 54. The upper element isolation layer 53 may be formed in the cell region CR. The upper element isolation layer 53 may be formed between the plurality of photodiodes 63. The via isolation layer 54 may be formed in the via region PR.

A process of forming the upper element isolation layer 53 and the via isolation layer 54 may include a process of forming a trench and a process of filling the trench with an insulating layer. In an embodiment, the upper element isolation layer 53 and the via isolation layer 54 may fully pass through the upper substrate 51. The upper element isolation layer 53 and the via isolation layer 54 may include the same material layers formed at the same time.

The upper capping layer 65 may be in direct contact with the upper element isolation layer 53 and the via isolation layer 54. In an embodiment, the upper capping layer 65 may be formed to be continuous with the upper element isolation layer 53 and the via isolation layer 54. The upper element isolation layer 53, the via isolation layer 54, and the upper capping layer 65 may include an insulating material, e.g., silicon oxide, silicon nitride, silicon oxynitride, silicon oxycarbonitride (SiOCN), low-k dielectrics, high-k dielectrics, or a combination thereof.

In an embodiment, at least one of the upper element isolation layer 53, the via isolation layer 54, and the upper capping layer 65 may include a metal oxide or a metal fluoride containing at least one of Hf, Zr, Al, Ta, Ti, Y, and lanthanoids. For example, the upper capping layer 65 may include hafnium oxide (HfO), aluminum fluoride (AlF), or a combination thereof. At least one of the upper element isolation layer 53, the via isolation layer 54, and the upper capping layer 65 may correspond to a fixed charge layer. In an embodiment, the upper capping layer 65 may include a material layer which is simultaneously formed with and the same as the upper element isolation layer 53 and the via isolation layer 54.

Figure 33:
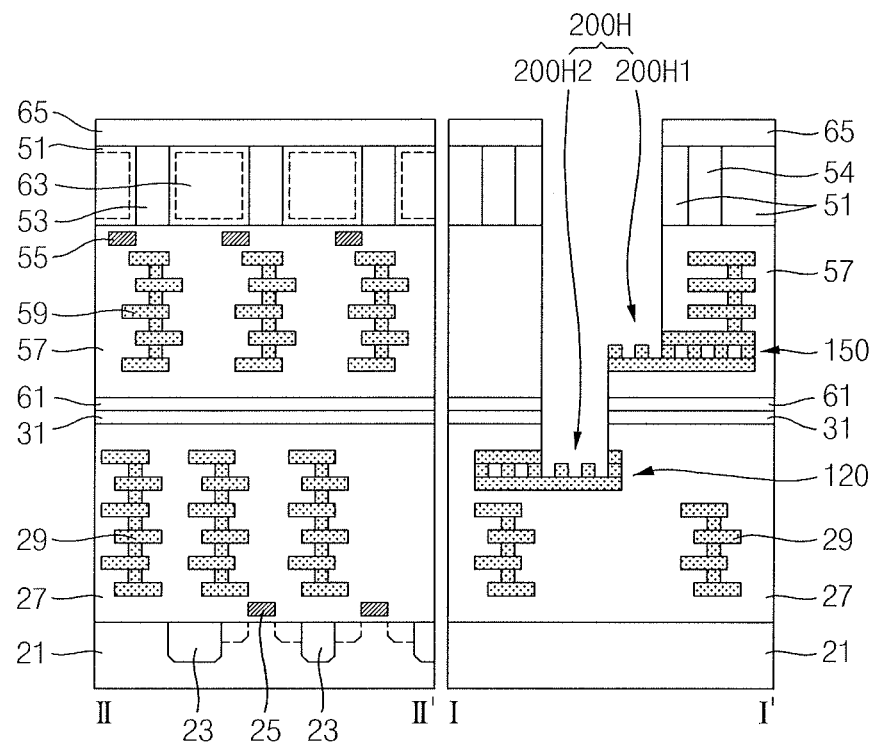

Referring to FIGS. 26 and 33, a via hole 200H may pass through the upper capping layer 65, the upper substrate 51, the upper insulating layer 57, the upper bonding layer 61, the lower bonding layer 31, and the lower insulating layer 27 and may expose the upper pad structure 150 and the lower pad structure 120 in the via region PR. The via hole 200H may include an upper via hole 200H1 and a lower via hole 200H2 which communicates with a lower portion of the upper via hole 200H1. A process for forming the via hole 200H may include a patterning process, e.g., an anisotropic etching process. The upper pad structure 150 and the lower pad structure 120 may also be partially etched during formation of the via hole 200H. The via hole 200H may have various shapes, for example, as illustrated in FIGS. 16 to 25.

Figure 34:
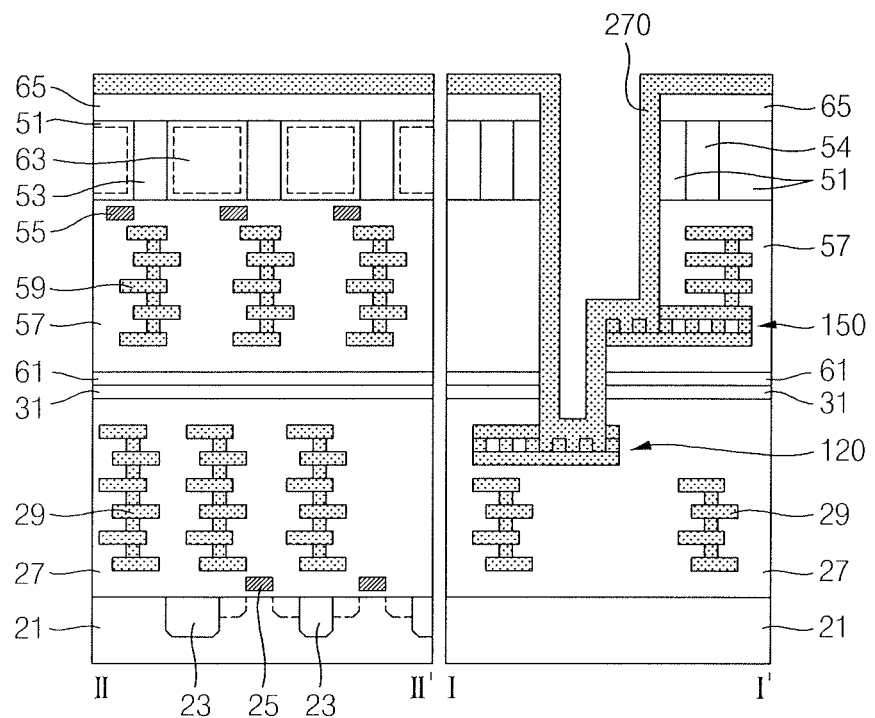

Referring to FIGS. 26 and 34, the via conductive layer 270 may be formed to cover an inner wall of the via hole 200H and the upper capping layer 65. The via conductive layer 270 may include a conductive material, e.g., a metal, a metal oxide, a metal nitride, a metal silicide, polysilicon, a conductive carbon, or a combination thereof. The via conductive layer 270 may be in direct contact with the upper pad structure 150 and the lower pad structure 120. The via conductive layer 270 may have various shapes, for example, as illustrated in FIGS. 16 to 25.

Figure 35:
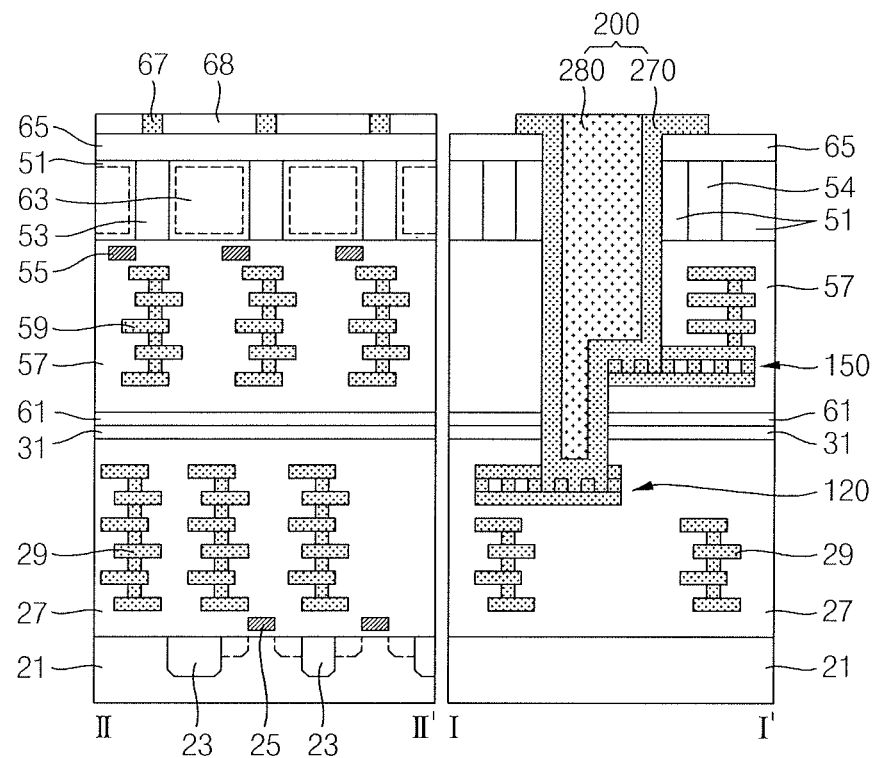

Referring to FIGS. 26 and 35, the light shielding pattern 67, the plurality of color filters 68, and the core pattern 280 may be formed. The light shielding pattern 67 and the plurality of color filters 68 may be formed on the upper capping layer 65 in the cell region CR. In an embodiment, the light shielding pattern 67 may be formed by patterning the via conductive layer 270. An interior of the via hole 200H may be fully filled with the core pattern 280. The via conductive layer 270 may surround side surfaces and a bottom of the core pattern 280. The core pattern 280 may include, for example, a conductive material, an insulating material, or a combination thereof. In an embodiment, the core pattern 280 may include a carbon-based material.

Referring again to FIGS. 26 and 27, the plurality of micro lenses 69 may be formed on the plurality of color filters 68.

Figure 36:
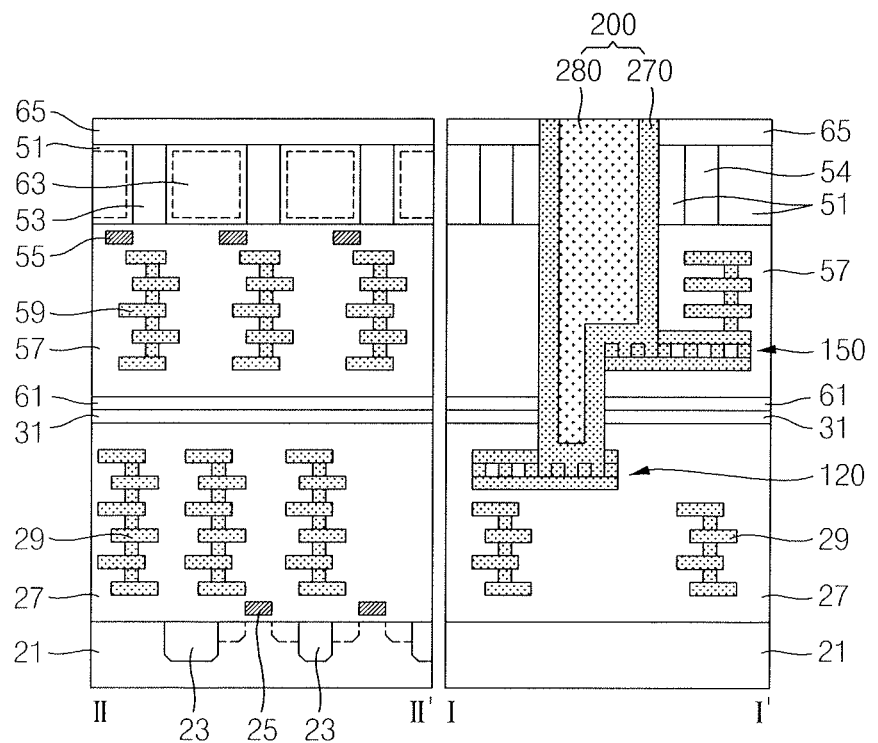

Referring to FIGS. 26 and 36, upper surfaces of the upper capping layer 65, the via conductive layer 270, and the core pattern 280 may be exposed at substantially the same surface. A process of forming the via conductive layer 270 and the core pattern 280 may include a planarization process, e.g., a chemical mechanical polishing (CMP) process, an etch-back process, or a combination thereof.

Figure 37:
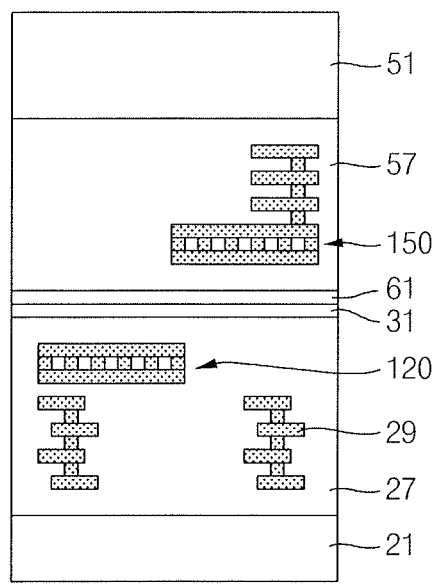

FIGS. 37 to 40 are cross-sectional views for describing another embodiment of a method for forming a semiconductor device. Referring to FIG. 37, a lower insulating layer 27, lower interconnection structures 29, a lower pad structure 120, and a lower bonding layer 31 may be formed on a lower substrate 21. An upper insulating layer 57, an upper pad structure 150, and an upper bonding layer 61 may be formed on an upper substrate 51. The upper bonding layer 61 may be bonded to the lower bonding layer 31. In one embodiment, the lower bonding layer 31 and the upper bonding layer 61 may be partially or fully omitted.

The upper insulating layer 57, the upper pad structure 150, and the upper bonding layer 61 are illustrated as being formed on the upper substrate 51. In an embodiment, the upper insulating layer 57, the upper pad structure 150, and the upper bonding layer 61 may be interpreted as being bonded upside down. In at least one embodiment, each of the lower bonding layer 31 and the upper bonding layer 61 may be referred to as a bonding layer.

Figure 38:
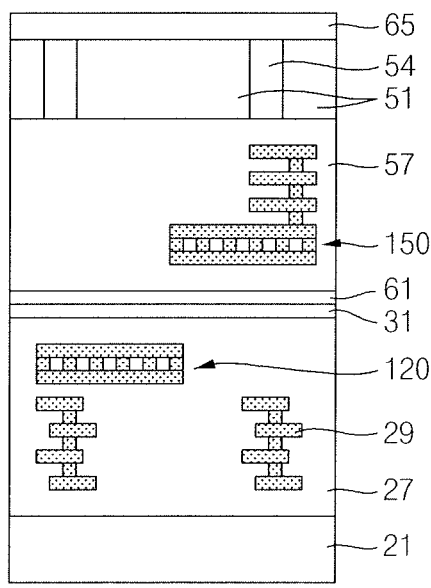

Referring to FIG. 38, a via isolation layer 54 may be formed to pass through the upper substrate 51. The upper substrate 51 may be divided into a plurality of electrically independent regions by the via isolation layer 54. An upper capping layer 65 may be formed on the via isolation layer 54 and the upper substrate 51.

Figure 39:
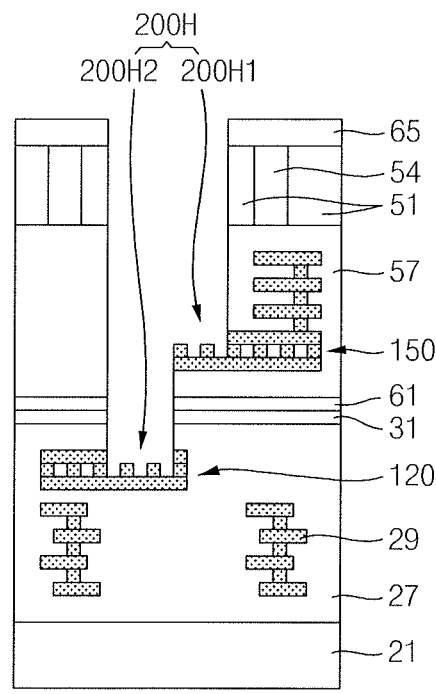

Referring to FIG. 39, a via hole 200H may be formed to pass through the upper capping layer 65, the upper substrate 51, the upper insulating layer 57, the upper bonding layer 61, the lower bonding layer 31, and the lower insulating layer 27 and may expose the upper pad structure 150 and the lower pad structure 120. The via hole 200H may include an upper via hole 200H1 and a lower via hole 200H2 which communicates with a lower portion of the upper via hole 200H1. The upper via hole 200H1 may have a greater width than the lower via hole 200H2. A process of forming the via hole 200H may include an anisotropic etching process. The upper pad structure 150 and the lower pad structure 120 may also be partially etched while during formation of the via hole 200H. Various configurations illustrated in FIGS. 16 to 24 may be implemented by controlling the process of forming the via hole 200H.

Figure 40:
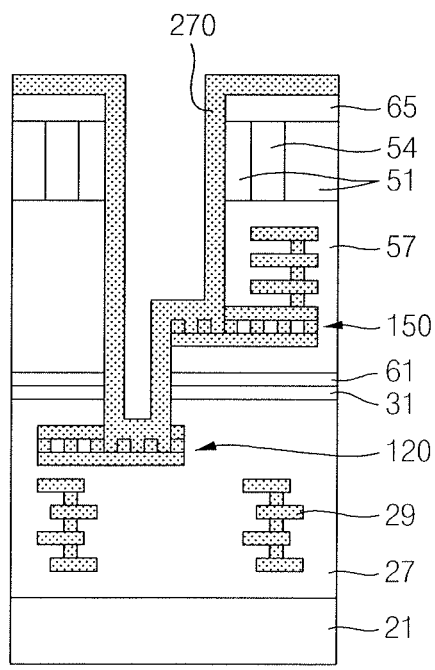

Referring to FIG. 40, a via conductive layer 270 may be formed in the via hole 200H. Referring again to FIG. 1, the core pattern 280 may be formed in the via hole 200H. The via conductive layer 270 may surround side surfaces and a bottom of the core pattern 280.

In accordance with one or more of the aforementioned embodiments, a via plug is connected to a lower pad structure and an upper pad structure. The upper pad structure may include a plurality of upper pad conductive layers and an upper connection layer. The lower pad structure may include a plurality of lower pad conductive layers and a lower connection layer. The via plug may be in contact with the upper pad conductive layers, the upper connection layer, and the lower pad structure. A contact area between the via plug and the upper pad structure may be significantly widened. A semiconductor device having a low electrical contact resistance may therefore be implemented.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A semiconductor device, comprising:
   a lower insulating layer on a lower substrate;
   a lower pad structure inside the lower insulating layer;
   an upper insulating layer on the lower insulating layer;
   an upper pad structure inside the upper insulating layer;
   an upper substrate on the upper insulating layer; and
   a via plug passing through at least a portion of each of the upper substrate, the upper insulating layer, and the lower insulating layer, the via plug in contact with the upper pad structure and the lower pad structure,
   wherein:
   the upper pad structure includes a plurality of upper pad conductive layers and an upper connection layer between the plurality of upper pad conductive layers,
   the upper connection layer includes a conductive pattern having a shape different from a shape of at least one of the upper pad conductive layers, and
   the via plug is in direct contact with the upper pad conductive layers and the upper connection layer.

2. The semiconductor device as claimed in claim 1, wherein each of the plurality of upper pad conductive layers and the upper connection layer includes a flat plate, a flat plate having a through hole, a plurality of bars, a lattice, a plurality of blocks, or a combination thereof.

3. The semiconductor device as claimed in claim 2, wherein the upper insulating layer is inside the upper connection layer.

4. The semiconductor device as claimed in claim 1, wherein:
   each of the plurality of upper pad conductive layers includes a first upper pad conductive layer and a second upper pad conductive layer on the first upper pad conductive layer;
   the upper connection layer is between the first upper pad conductive layer and the second upper pad conductive layer; and
   the via plug is in contact with the first upper pad conductive layer, the upper connection layer, and the second upper pad conductive layer.

5. The semiconductor device as claimed in claim 4, wherein the via plug is in contact with a side surface of the second upper pad conductive layer, an upper surface and a side surface of the upper connection layer, and an upper surface and a side surface of the first upper pad conductive layer.

6. The semiconductor device as claimed in claim 4, wherein the via plug is in contact with an upper surface and a side surface of the second upper pad conductive layer, a side surface of the upper connection layer, and a side surface of the first upper pad conductive layer.

7. The semiconductor device as claimed in claim 4, wherein the via plug is in contact with a side surface of the second upper pad conductive layer, a side surface of the upper connection layer, and a side surface of the first upper pad conductive layer.

8. The semiconductor device as claimed in claim 4, wherein:
the lower pad structure includes a plurality of lower pad conductive layers and a lower connection layer formed between the plurality of lower pad conductive layers; and
each of the lower pad conductive layers and the lower connection layer includes a flat plate, a flat plate having a through hole, a plurality of bars, a lattice, a plurality of blocks, or a combination thereof.

9. The semiconductor device as claimed in claim 8, wherein the lower connection layer includes a conductive pattern having a shape different from a shape of at least one of the lower pad conductive layers.

10. The semiconductor device as claimed in claim 8, wherein:
each of the plurality of lower pad conductive layers includes a first lower pad conductive layer and a second lower pad conductive layer at a lower level than the first upper pad conductive layer;
the lower connection layer is between the first lower pad conductive layer and the second lower pad conductive layer; and
the via plug is in contact with the first lower pad conductive layer, the lower connection layer, and the second lower pad conductive layer.

11. The semiconductor device as claimed in claim 10, wherein the via plug passes through the first lower pad conductive layer and is in contact with a side surface of the first lower pad conductive layer, an upper surface and a side surface of the lower connection layer, and an upper surface of the second lower pad conductive layer.

12. The semiconductor device as claimed in claim 1, further comprising:
a via isolation layer configured passing through the upper substrate,
wherein the upper substrate remains between the via plug and the via isolation layer.

13. The semiconductor device as claimed in claim 1, further comprising:
at least one bonding layer between the lower insulating layer and the upper insulating layer, wherein the via plug passes through the at least one bonding layer.

14. A semiconductor device, comprising:
a lower insulating layer on a lower substrate;
a lower pad structure inside the lower insulating layer;
an upper insulating layer on the lower insulating layer;
an upper pad structure inside the upper insulating layer and adjacent to the lower pad structure;
an upper substrate on the upper insulating layer; and
a via plug overlapping the upper pad structure and the lower pad structure, wherein the upper pad structure includes a plurality of upper pad conductive layers and an upper connection layer formed between the plurality of upper pad conductive layers, wherein the upper connection layer includes a conductive pattern having a shape different from that of at least one of the upper pad conductive layers, and wherein the via plug overlaps the upper connection layer,
wherein the via plug is in direct contact with the upper pad conductive layers and the upper connection layer.

15. The semiconductor device as claimed in claim 14, wherein:
each of the upper pad conductive layers and the upper connection layer includes a flat plate, a flat plate having a through hole, a plurality of bars, a lattice, a plurality of blocks, or a combination thereof; and
the upper insulating layer is inside the upper connection layer.

16. The semiconductor device as claimed in claim 14, further comprising:
a pad hole passing through the upper pad structure and overlapping the via plug and the lower pad structure.

17. The semiconductor device as claimed in claim 14, wherein:
the lower pad structure includes a plurality of lower pad conductive layers and a lower connection layer between the plurality of lower pad conductive layers,
each of the lower pad conductive layers and the lower connection layer includes a flat plate, a flat plate having a through hole, a plurality of bars, a lattice, a plurality of blocks, or a combination thereof;
the lower connection layer includes a conductive pattern having a shape different from a shape of the lower pad conductive layers; and
the via plug overlaps the lower connection layer.

18. The semiconductor device as claimed in claim 17, wherein the via plug is in direct contact with the lower pad conductive layers and the lower connection layer.

19. A semiconductor device, comprising:
a lower insulating layer on a lower substrate;
a lower pad structure inside the lower insulating layer;
an upper insulating layer on the lower insulating layer;
an upper pad structure inside the upper insulating layer;
an upper substrate having a cell region and a via region on the upper insulating layer;
a photodiode inside the upper substrate in the cell region; and
a via plug passing through at least a portion of each of the upper substrate, the upper insulating layer, and the lower insulating layer in the via region, the via plug in contact with the upper pad structure and the lower pad structure, wherein:
the upper pad structure includes a plurality of upper pad conductive layers and an upper connection layer between the plurality of upper pad conductive layers,
the upper connection layer includes a conductive pattern having a shape different from a shape of at least one of the upper pad conductive layers, and
the via plug is in direct contact with the upper pad conductive layers and the upper connection layer.

* * * * *